United States Patent [19]

Goldenberg

[11] Patent Number: 5,245,245
[45] Date of Patent: Sep. 14, 1993

[54] MASS-LOADED CANTILEVER VIBRATOR

[75] Inventor: Michael P. Goldenberg, Boynton Beach, Fla.

[73] Assignee: Motorola, Inc., Schaumburg, Ill.

[21] Appl. No.: 878,348

[22] Filed: May 4, 1992

[51] Int. Cl.[5] .......................................... H01L 41/08
[52] U.S. Cl. ...................................... 310/330; 310/321; 310/312; 340/825.44
[58] Field of Search ............... 310/311, 312, 321, 323, 310/330–332; 340/311.1, 825.44, 146.2; 455/34, 38, 228, 343; 375/58

[56] References Cited

U.S. PATENT DOCUMENTS

| | | | |
|---|---|---|---|
| 2,045,427 | 6/1936 | White | 310/332 X |
| 3,229,387 | 1/1966 | Linvill | 310/331 X |
| 3,336,529 | 8/1967 | Tygart | 310/331 X |
| 3,445,843 | 5/1969 | Pena | 310/332 X |
| 3,513,899 | 7/1970 | Taylor | 310/330 X |
| 3,712,962 | 1/1973 | Epley | 310/332 X |
| 4,518,961 | 5/1985 | Davis | 340/825.44 |
| 5,008,580 | 4/1991 | Masuda et al. | 310/331 X |
| 5,068,567 | 11/1991 | Jones | 310/332 |

Primary Examiner—Mark O. Budd
Attorney, Agent, or Firm—Jose Gutman; William E. Koch; Thomas G. Berry

[57] ABSTRACT

An electronic device (100) includes a housing (222) and a piezo-bender (400). The piezo-bender (400) includes a metal beam (402) having at least a portion of a surface mechanically coupled to a piezo-ceramic layer (304). The piezo-bender (400) is flexibly coupled to the housing (222) at an end of the metal beam (402) forming a cantilever structure. A vibratable body (404) is mechanically coupled to the other end of the metal beam (402). A tuning slide (604) is slidably coupled to the piezo-bender (400) for mechanically tuning the resonant frequency of vibration of the piezo-bender (400) by varying the length of the piezo-bender (400) that can vibrate. An electrical drive circuit (708) is electrically coupled to the piezo-bender (400) for electrically driving the piezo-bender (400) with a drive signal to generate vibratory motion in the piezo-bender (400) for providing a vibratory alert.

3 Claims, 4 Drawing Sheets

MASS-LOADED CANTILEVER VIBRATOR

FIELD OF THE INVENTION

This invention relates generally to vibrators in electronic devices, such as selective call receivers, and more particularly, to a low-profile vibrator in an electronic device.

BACKGROUND OF THE INVENTION

Many electronic devices, such as selective call receivers, provide an alert to a user of the device. The alert can include a sensory alert, such as an audible alert or a tactile alert. The audible alert typically is provided by a transducer or speaker, and the tactile alert is provided by a vibrator motor employing an unbalanced rotating counterweight which delivers relatively "silent" mechanical vibrations that can be felt by a user.

With the current trend toward smaller, more portable, and reliable selective call receivers, the larger alerting devices of the past are becoming increasingly unacceptable. Further, the larger number of mechanical parts required for the past implementations of the alerting devices provide more opportunities for defects. Having large number of mechanical parts makes it difficult to meet increasingly stricter quality requirements demanded by consumers, and to enhance the reliability of operation of the electronic device.

Thus, what is required is a low-profile and reliable vibrator for a selective call receiver.

SUMMARY OF THE INVENTION

According to an embodiment of the present invention, there is provided an electronic device comprising a housing and a piezo-bender including a metal beam having at least a portion of a surface mechanically coupled to a piezo-ceramic layer, the piezo-bender being flexibly coupled to the housing at an end of the metal beam forming a cantilever structure. A vibratable body is mechanically coupled to the other end of the metal beam. A tuning means is slidably coupled to the piezo-bender for mechanically tuning the resonant frequency of vibration of the piezo-bender by varying the length of the piezo-bender that can vibrate. An electrical drive circuit is electrically coupled to the piezo-bender for electrically driving the piezo-bender with a drive signal to generate vibratory motion in the piezo-bender for providing a vibratory alert.

DESCRIPTION OF A PREFERRED EMBODIMENT

Figure 1:
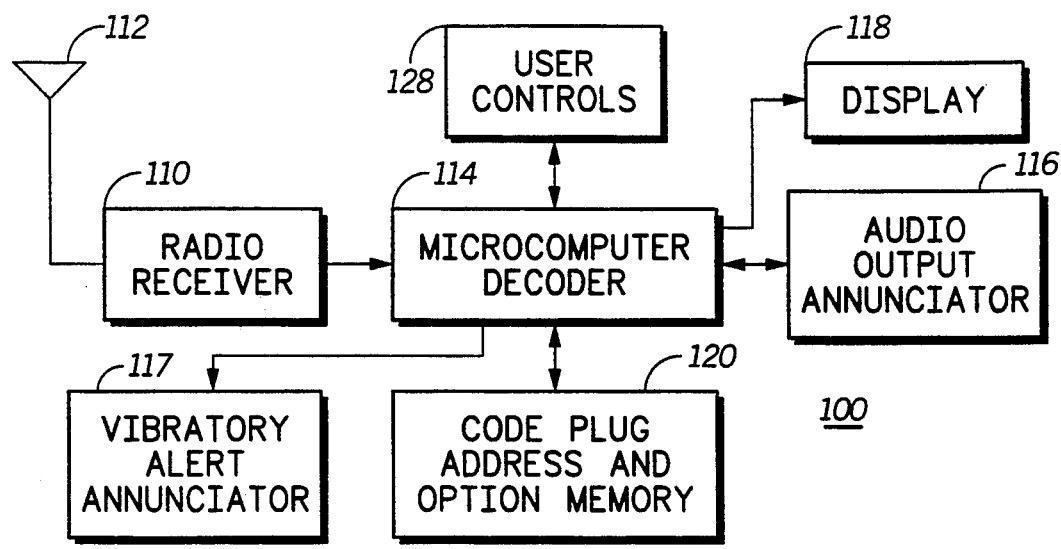
FIG. 1 is a block diagram of a paging receiver, according to the present invention.

FIG. 1 is an electrical block diagram of a selective call receiver, e.g. a pager 100. It includes radio receiver circuitry 110 which receives signals via an antenna 112. The received signals include paging information. Selective call receivers can respond to transmitted information containing various combinations of tone, tone and voice, or data messages in a variety of modes. This information may be transmitted using several paging coding schemes and message formats.

The output of the radio receiver circuitry 110 is applied to a microcomputer decoder 114 which processes the information contained in the received signals, to decode any received message. As can be seen, the microcomputer decoder 114 communicates with an audio output annunciator 116, to alert a user that a message has been received.

The audio output annunciator 116 may include a transducer or vibrator for emitting an audible alert. Typically, the audible alert includes a tone having a frequency greater than approximately 300 Hz, and preferably about 2500 to 3000 Hz.

Additionally, a vibratory alert annunciator 117 is driven from the microcomputer 114, and includes a transducer or vibrator for providing a tactile alert to a user. Normally, the tactile alert includes a mechanical frequency of vibration below approximately 300 Hz, and preferably about 171 Hz. The tactile alert is substantially a silent alert, which is known only to the user of the paging device 100.

Additionally, the microcomputer decoder 114 communicates with a display 118, such as a liquid crystal display (LCD), to present a message via the display 118, and with a code plug address and option memory 120 to retrieve predetermined address and function information. Normally, after a received address matches a predetermined address in the pager 100, the audio output annunciator 116 the vibratory alert annunciator 117, or a combination of the two annunciators alerts the user that a message has been received. The user can activate user controls 128, such as buttons or switches, to invoke functions in the pager 100, and optionally to view the received message on the display 118. The general operation of a paging receiver of the type shown in FIG. 1 is well known and is more fully described in U. S. Pat. No. 4,518,961, issued May 21, 1985, entitled "Universal Paging Device with Power Conservation", which is assigned to the same assignee as the present invention and is incorporated herein by reference.

Figure 2:
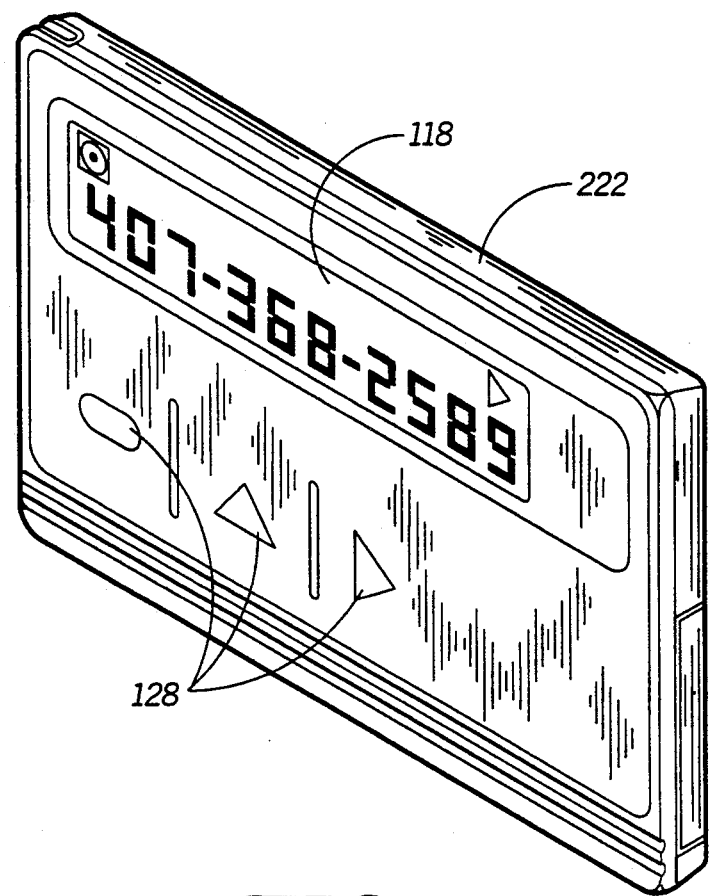
FIG. 2 is an isometric view of a paging receiver in a credit card format, in accordance with the present invention.

FIG. 2 is an isometric view of a paging receiver constructed in a low volumetric (e.g. credit card) format. As can be seen, the pager includes a housing 222. A display 118 is visible through an aperture in the front of the housing 222, and user operated controls 128 are also provided.

Figure 3:
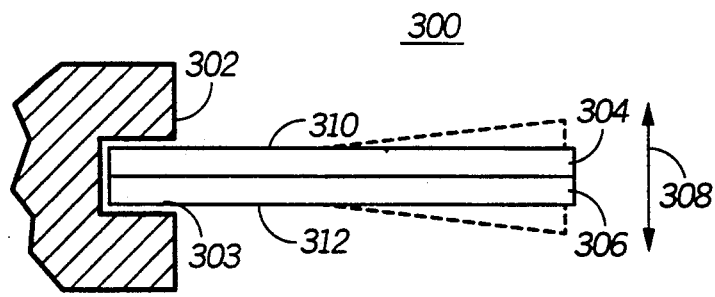
FIG. 3 is a side view of a piezo-bender vibrator constructed and arranged in a cantilever structure, according to the present invention.

FIG. 3 is a side view of a piezo-bender vibrator 300 constructed and arranged in a cantilever structure, according to the present invention. A piezo-ceramic layer 304 can be mechanically coupled to a metal beam 306, such as by being laminated on the metal beam 306. The combination of the piezo-ceramic layer 304 and the metal beam 306 forms a piezo-bender 300. When the piezo-bender is captured at one end 303, such as by a housing 302, the arrangement is a cantilever structure. When an electrical driving signal is electrically coupled to the piezo-bender 300 across two surfaces 310, 312, the piezo-bender 300 will begin to vibrate 308. The frequency and amplitude of vibration of the piezo-bender will be determined by a number of factors, such as the frequency and amplitude of the driving signal and the natural mechanical resonant frequency of the piezo-bender. To maximize the deflections 308 of the piezo-bender 300, the frequency of the driving signal can be selected to approximate the natural mechanical resonant frequency of the piezo-bender 300. In this way, for example, an electrical driving signal may be applied across the opposing surfaces 310, 312, of the piezo-bender 300 to impart vibratory motion to the piezo-bender 300.

Figure 4:
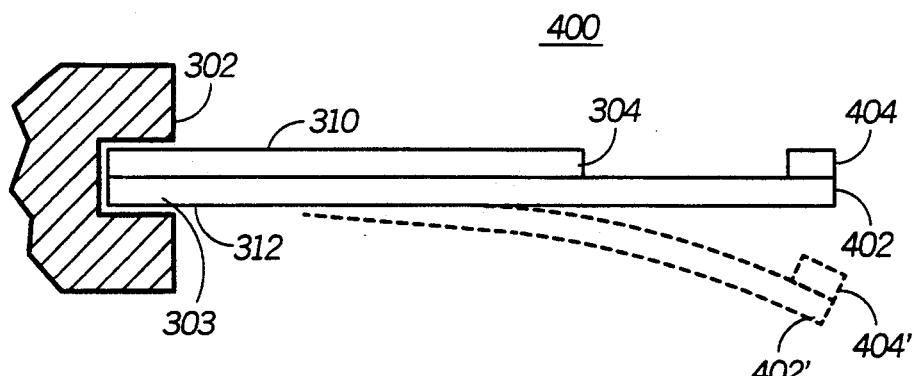
FIG. 4 is a side view of a mass-loaded cantilever piezo-bender vibrator, according to the preferred embodiment of the present invention.

FIG. 4 is a side view of a mass-loaded cantilever piezo-bender vibrator 400, according to the preferred embodiment of the present invention. Here, the metal beam 402 has a portion of its surface mechanically coupled to the piezo-ceramic layer 304. The metal beam 402 extends well beyond the piezo-ceramic layer 304 and has a mass 404 mechanically coupled to the other end of the metal beam 402. The mass 404 may be spot welded to the metal beam 402, and provides a vibratable body at one end of the cantilever structure. The other end 303 of the piezo-bender 400 is captured by the housing 302. When an electrical driving signal is applied, for example, across the opposing surfaces 310, 312, of the piezo-bender 400, the piezo-bender 400 begins to vibrate. The deflections of the piezo-bender 400 are significantly greater because of the extension of the metal beam 402 beyond the piezo-ceramic layer 304 and because of the mass 404 at the end of the beam 402. The vibrating mass 404' and vibrating beam 402' tend to impart greater impulses to the housing 302 through each vibration cycle. Therefore, the mass-loaded piezo-bender 400 tends to provide stronger vibrations to the housing 302 than the previous piezo-bender arrangement 300.

Figure 5:
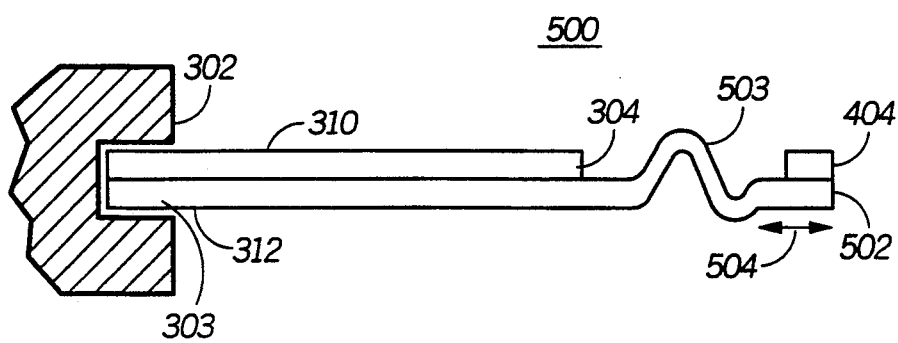
FIG. 5 is a side view of a mass-loaded cantilever piezo-bender vibrator including a longitudinal spring feature, according to an optional embodiment of the present invention.

Optionally, a mass-loaded piezo-bender 500 can include a longitudinal spring feature 503 between the piezo-ceramic captured end 303 of the piezo-bender 500 and the mass-loaded end 404. Preferably, the longitudinal spring feature 503 comprises a bend in the metal beam 502, which provides sufficient spring action 504 to protect the piezo-ceramic layer 304 from undue stress in the event that the electronic device experiences a mechanical shock in the longitudinal direction 504 of the piezo-bender 500. Such a mechanical shock may be experienced from dropping the electronic device onto a hard surface. A significantly large mechanical shock can cause enough stress in the piezo-ceramic layer 304 to crack the piezo-ceramic layer 304. Therefore, where large mechanical shocks may be experienced by the device, it is preferable to include the longitudinal spring feature 503 in the piezo-bender 500, as shown in FIG. 5. Additionally, a plurality of mechanical stops can surround the mass-loaded end of the piezo-bender 500 for protection. These stops (not shown) can prevent the beam 502 from deflecting beyond defined limits, such as the range of normal deflections for a vibratory alert. In this way, additional protection by the stops prevents the piezo-ceramic layer 304 from over stressing and possibly cracking due to a large mechanical shock.

Figure 6:
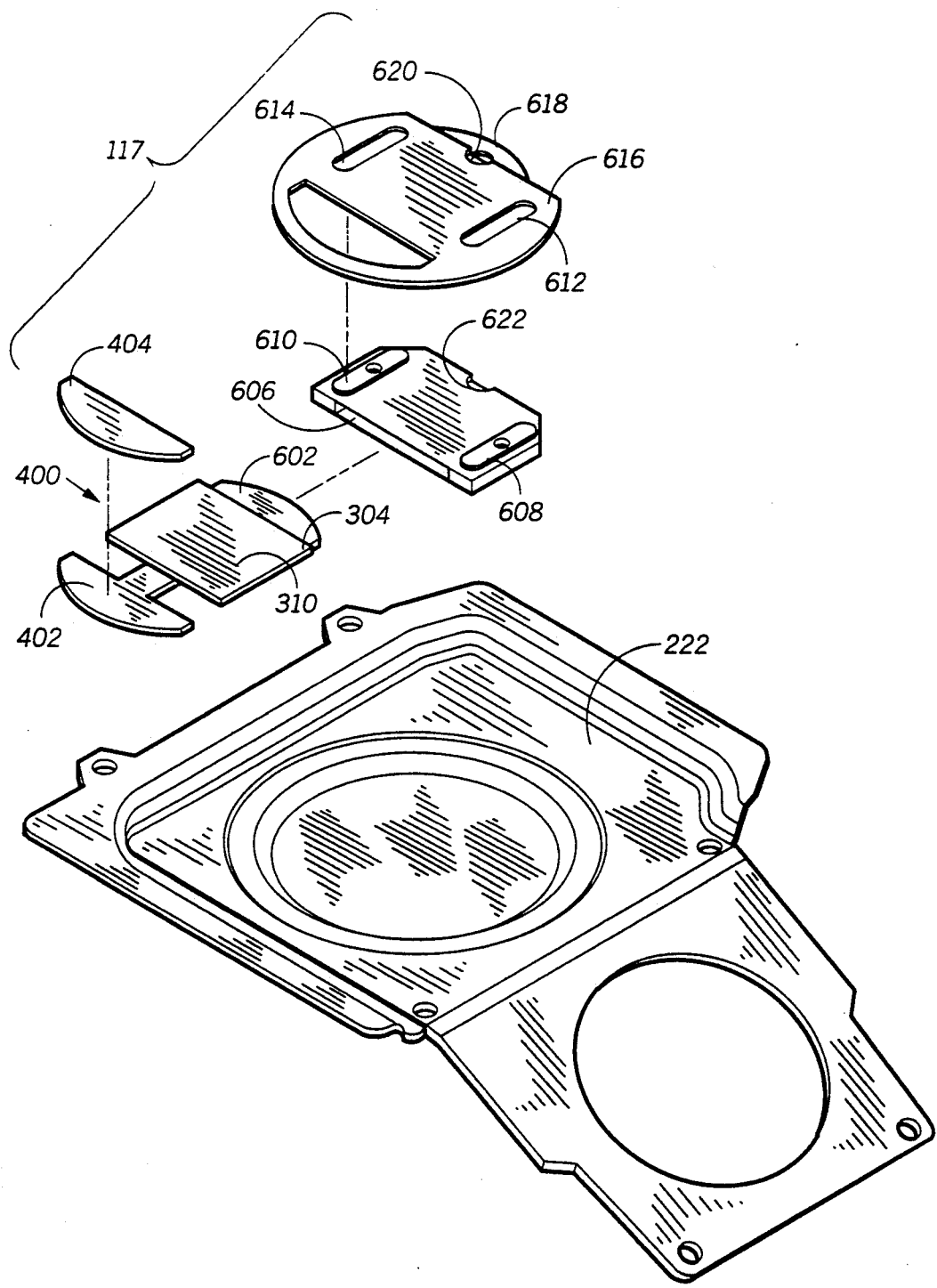
FIG. 6 is an exploded view of a pager including the mass-loaded cantilever vibrator of FIG. 4, in accordance with a preferred embodiment of the present invention.

FIG. 6 illustrates a perspective view of the mass-loaded cantilever vibrator 400 (FIG. 4) shown in a pager 100 to provide the vibratory alert annunciator 117, in accordance with a preferred embodiment of the present invention. The piezo-ceramic layer 304 is laminated to the metal beam 402, and the mass 404 is spot welded to the end of the metal beam 402.

In the preferred embodiment, a mechanical tuning slide 604 is included for tuning the mechanical resonant frequency of vibration of the piezo-bender 400 by varying the length of the cantilever structure that can vibrate. The slide 604 includes a slot 606 which receives the end 602 of the metal beam 402. By adjusting the slide 604 longitudinally across the piezo-bender 400, the natural mechanical resonant frequency of the system can be tuned. A metal cover piece 616 fits over the slide 604 and the piezo-bender 400. The end 602 of the metal beam 402 is spot welded to the end 618 of the metal cover piece 616. Then, the entire assembly, including the metal cover piece 616, the slide 604, and the piezo-bender 400, is spot welded to the base portion of the pager housing 222. A pair of slide features 608, 610, fit into a pair of cover channels 612, 614, to help guide the slide 604 across the piezo-bender 400. By sliding the slide 604 over the piezo-bender 400 to mechanically adjust (tune) the natural mechanical frequency of vibration of the piezo-bender 400, a technician can match the natural mechanical resonant frequency of the piezo-bender 400 to a predetermined frequency of an electrical driving signal. That is, the technician may select a frequency for the electrical driving signal and then mechanically tune the natural resonant frequency of the piezo-bender 400 to better match the selected frequency of the electrical driving signal. These manufacturing techniques provide adjustments for slight variations in the dimensions and compositions of the elements of the piezo-bender 400 in a manufacturing process, while providing optimal vibrations from the piezo-bender 400 by substantially matching the mechanical resonant frequency of the piezo-bender 400 with the frequency of the electrical driving signal.

Typically, the housing 222 is electrically grounded. Likewise, the metal beam 402 which is spot welded to the housing 222 is also electrically grounded. An aperture 620 in the metal cover 616 and a cut-out feature 622 in the slide 604 provide access to the top surface 310 of the piezo-ceramic layer 304 to electrically couple the electrical driving signal across the piezo-bender 400, as will be more fully discussed below.

Figure 7:
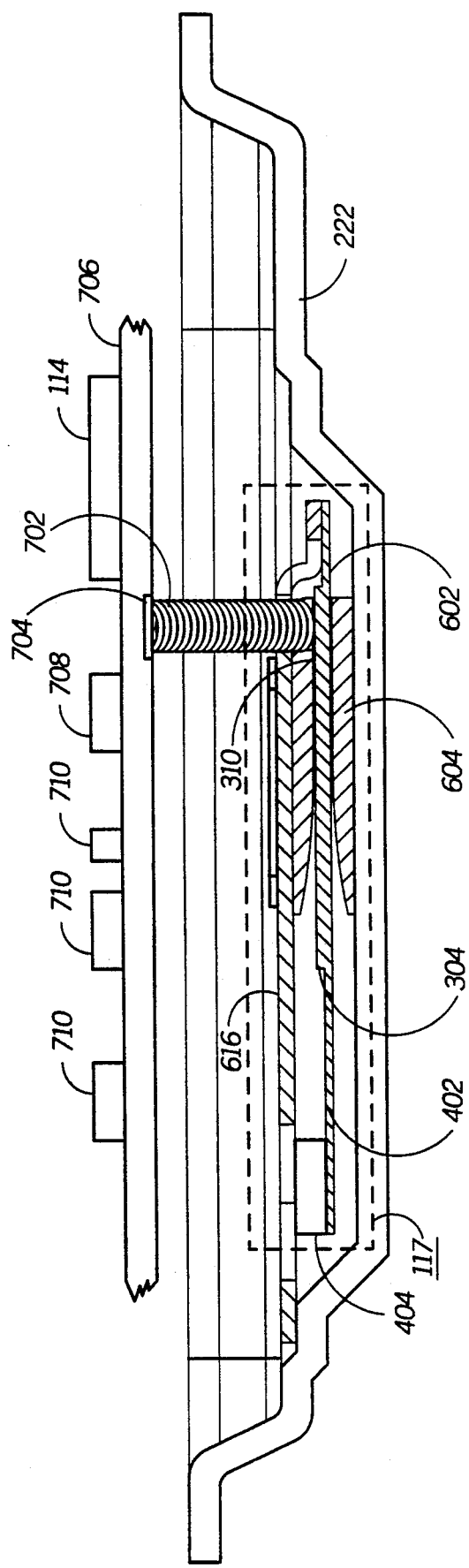
FIG. 7 is a cross-sectional side view of the mass-loaded cantilever vibrator in the pager of FIG. 6, according to the preferred embodiment of the present invention.

FIG. 7 is a cross-sectional side view of the mass-loaded cantilever vibrator or vibratory alert annunciator 117 in the pager 100, according to the preferred embodiment of the present invention. Electrical contact coil 702 extends through the aperture 620 in the top cover 616 and through the cut-out feature 622 in the slide 604 to make electrical contact with the top surface 310 of the piezo-ceramic layer 304. The other end of the electrical spring contact 702 makes electrical contact with pad 704 on the circuit supporting substrate 706. Alert generating circuitry 708 is electrically coupled to the pad 704 via the circuit supporting substrate 706 and can couple the electrical driving signal to the vibrator 117 to generate the vibratory alert. The alert generating circuitry 708 is electrically controlled by the microcomputer 114, which is also disposed on the circuit supporting substrate 706. Other electronic circuitry 710 may also be disposed on the circuit supporting substrate 706. For example, it may include the radio receiver circuitry 110 and the code plug address and option memory 120.

As can be seen, the mass-loaded cantilever vibrator 117 requires very little space to operate, and can provide a very low profile for the pager 100. Additionally, it requires very few moving parts. This can significantly enhance the reliability of the product. Further, the technician can mechanically tune the natural mechanical resonant frequency of the vibrator to more accurately match the frequency of an electrical driving signal, thereby making the manufacturing process more tolerant of slight changes in the dimensions and construction of the vibrator 117. This all adds to increased quality and enhanced reliability in the delivered product.

Figure 8:
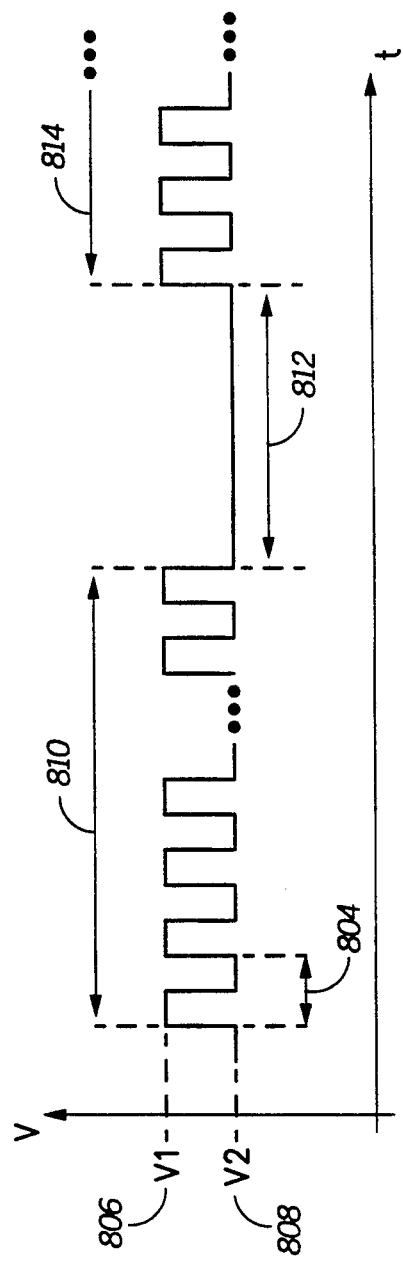
FIG. 8 is a voltage-versus-time chart illustrating an exemplary waveform for a signal for driving the mass-loaded cantilever vibrator in the pager of FIG. 6, according to the preferred embodiment of the present invention.

To electrically drive the piezo-bender 400, the alert generating circuitry 708 preferably provides a series of drive pulses of the desired voltage amplitude 806, 808, and frequency 804, as illustrated in FIG. 8. The microcomputer 114, in the preferred embodiment, controls the alert generating circuitry 708 via one or more port lines which can enable/disable the alert generating circuitry 708 to generate the series of voltage pulses for a predetermined time interval. Preferably, the alert generating circuitry 708 continues to generate the drive pulses 810 while enabled, and stops generating the drive pulses when disabled 812. The drive pulses can begin again 814 upon another enable control from the microcomputer 114. The voltage levels 806, 808, for the drive pulses 810, 814, can be selected in the design of the vibrator to provide sufficient impulse for sensory perception by the user of the device, preferably about 30 volts. The amplitude of the impulses generated by the vibrator 117 can be significantly enhanced by matching the mechanical resonant frequency of the piezo-bender 400 to the frequency 804 of the drive pulses 810, as discussed earlier. Due to its low profile and few moving parts, the mass-loaded cantilever vibrator 117 provides significant advantages to the pager 100 in both size and reliability for the product.

Thus, the mass-loaded cantilever vibrator provides a low-profile and reliable vibrator for electronic devices. It has a very low profile and few moving parts, which makes the vibrator especially useful in portable communication devices such as selective call receivers 100.

What is claimed is:

1. An electronic device capable of providing a vibratory alert, comprising:
   a housing;
   a piezo-bender including a metal beam having at least a portion of a surface mechanically coupled to a piezo-ceramic layer, the piezo-bender being flexibly coupled to the housing at an end of the metal beam forming a cantilever structure, and a vibratable body mechanically coupled to the other end of the metal beam;
   a tuning means slidably coupled to the piezo-bender for mechanically tuning the resonant frequency of vibration of the piezo-bender by varying the length of the piezo-bender that can vibrate; and
   an electrical drive circuit electrically coupled to the piezo-bender for electrically driving the piezo-bender with a drive signal to generate vibratory motion in the piezo-bender for providing a vibratory alert.

2. A selective call receiver, comprising: 'a housing;
   a circuit supporting substrate within the housing and mechanically coupled thereto;
   electronic circuitry disposed on the circuit supporting substrate, the electronic circuitry including:
      receiving means for receiving a message comprising an address;
      decoding means coupled to the receiving means for decoding the received message, and for determining if the received address matches a predetermined address; and
      alert generating means coupled to the decoding means for electrically generating an alert signal if the received address matches the predetermined address; and
   vibratory alert means for providing a vibratory alert in response to the alert signal, the vibratory alert means comprising:
      a piezo-bender including a metal beam having at least a portion of a surface mechanically coupled to a piezo-ceramic layer, the piezo-bender being flexibly coupled to the housing at an end of the metal beam forming a cantilever structure, and a vibratable body mechanically coupled to the other end of the metal beam, and being electrically coupled to the alert generating means and responsive to the alert signal for electrically driving the piezo-bender with the alert signal to generate vibratory motion in the piezo-bender for providing a vibratory alert; and
      a tuning slide slidably coupled to the piezo-bender for mechanically tuning the resonant frequency of vibration of the piezo-bender by varying the length of the piezo-bender that can vibrate.

3. The selective call receiver of claim 2, wherein the alert signal for electrically driving the piezo-bender comprises a frequency in the range below 300 Hz for vibrating the piezo-bender to provide a tactile alert.

* * * * *